United States Patent

Jang et al.

[11] Patent Number: 6,107,144
[45] Date of Patent: Aug. 22, 2000

[54] METHOD FOR FORMING FIELD OXIDE OF SEMICONDUCTOR DEVICE AND THE SEMICONDUCTOR DEVICE

[75] Inventors: Se Aug Jang; Young Bog Kim; In Seok Yeo; Jong Choul Kim, all of Kyoungki-do, Rep. of Korea

[73] Assignee: Hyundai Electronics Industries Co., Ltd., Ichon-shi, Rep. of Korea

[21] Appl. No.: 09/070,911

[22] Filed: May 4, 1998

[30] Foreign Application Priority Data

Jun. 26, 1997 [KR] Rep. of Korea .................. 97-27720

[51] Int. Cl.⁷ .................. H01L 21/336; H01L 21/76
[52] U.S. Cl. .................. 438/297; 438/425; 438/439
[58] Field of Search ...................... 438/297, 439, 438/425, 445

[56] References Cited

U.S. PATENT DOCUMENTS

| | | |
|---|---|---|
| 5,139,964 | 8/1992 | Onishi et al. . |
| 5,173,444 | 12/1992 | Kawamura . |
| 5,399,520 | 3/1995 | Jang . |
| 5,554,560 | 9/1996 | Hsue et al. . |
| 5,637,529 | 6/1997 | Jang et al. . |
| 5,747,376 | 5/1998 | Lee . |
| 5,824,594 | 10/1998 | Kim et al. . |
| 5,891,789 | 4/1999 | Lee . |

FOREIGN PATENT DOCUMENTS 2 306 780    5/1997    United Kingdom .

*Primary Examiner*—John F. Niebling
*Assistant Examiner*—Josetta Jones
*Attorney, Agent, or Firm*—Jacobson, Price, Holman & Stern, PLLC

[57] ABSTRACT

A method for forming a field oxide of a semiconductor device and the semiconductor device. In order to form the field oxide, first, an element isolation mask is constructed on a semiconductor substrate. Then, a nitride spacer is formed at the side wall of the mask. At this time, a nitrogen-containing polymer is produced on the field region. The exposed region of the semiconductor substrate is oxidized at a temperature of 1,050–1,200° C. to grow a recess-oxide while transforming the nitrogen-containing polymer into a nitride. Thereafter, the recess oxide is removed, together with the nitride, to create a trench in which the field oxide is formed through thermal oxidation. Therefore, the method can prevent an FOU phenomenon upon the growth of a field oxide and improve the field oxide thinning effect, thereby bringing a significant improvement to the production yield and the reliability of a semiconductor device.

7 Claims, 4 Drawing Sheets

METHOD FOR FORMING FIELD OXIDE OF SEMICONDUCTOR DEVICE AND THE SEMICONDUCTOR DEVICE

BACKGROUND OF THE INVENTION

1. Field of the Invention

The present invention relates to a method for forming a field oxide of a semiconductor device and to the semiconductor device. More particularly, the present invention relates to a novel LOCOS (LOCal Oxidation of Silicon) technique by which semiconductor devices can be highly integrated.

2. Description of the Prior Art

In order to better understand the background of the invention, a description will be given of conventional techniques in conjunction with some figures.

Referring to FIG. 1, there is a conventional method of forming an element isolation film of a semiconductor device.

First, there is prepared a semiconductor substrate 11 over which a pad oxide 12 and a nitride 13 are sequentially formed, as shown in FIG. 1a. The nitride 13 and the pad oxide 12 are selectively etched at a field region to provide an element isolation mask which is, then, entirely covered with a nitride. It is dry-etched to form a nitride spacer at the side wall of the element isolation mask. After this dry-etching, a nitrogen-containing polymer P always remains on the field region of the semiconductor substrate.

FIG. 1b is a cross section after the exposed region of the semiconductor substrate 11 is oxidized at 800–900° C. to grow a recess-oxide 15. During this oxidation, the polymer P diffuses into the semiconductor substrate 11 below the recess oxide 15.

FIG. 1c is a cross section after the recess oxide 15 is subjected to wet-etching to form a trench T in the semiconductor substrate 11, followed by the oxidation of the exposed semiconductor substrate 11 to form a field oxide 16.

As mentioned, the conventional technique has an advantage of forming a trench at an accurate depth in a semiconductor substrate by wet-etching the recess oxide but is disadvantageous in that the nitrogen-containing polymer remains on the field region of the semiconductor substrate as a result of the dry-etchings.

Whereas the formation of the nitrogen-containing polymer occurs minorly in the place where the area ratio of active region to field region is small, such as a cell region, a large amount of the nitrogen-containing polymer is formed in peripheral circuits in which the area of active region is relatively very great as compared with that of field region.

The nitrogen-containing polymer which is formed during the nitride etching steps, is released outside or redeposited on gully-shaped field regions, but because the polymer is formed at a large amount in peripheral circuit regions, a part of the polymer remains on the bottom of the field region.

The nitrogen-containing polymer is not easily removed by conventional wet washing as it binds to the semiconductor substrate.

Because the recess-oxide is very thin, the oxidation is generally carried out at a low temperature of approximately 800–900° C. to easily control the thickness of the oxide. In this case, the nitrogen in the polymer P shown in FIG. 1a is redistributed in the interface between the recess oxide and the semiconductor substrate upon the growth of the recess oxide 15 and the redistributed nitrogen-containing polymer still remains in the semiconductor substrate even after the removal of the recess oxide with a hydrofluoric acid etchant, as shown in FIG. 1c.

In general, the element isolation processes based on LOCOS yield a field oxide thinning effect, in which thinner field oxides are grown as the oxidation window is narrower and the field oxidation temperature is lower. The data of FIG. 2 show that the field oxide thinning effect can be overcome by increasing the field oxidation temperatures. If a serious field oxide thinning effect occurs, threshold voltages of parasitic transistors and punchthrough voltages are disadvantageously lowered.

However, when the temperature at which the field oxide is grown is as high as or higher than 1,050° C., the nitrogen-containing polymer of FIG. 1c is thermally activated and instantaneously transformed into a nitride which acts as a barrier against the growth of the field oxide. In result, a field-oxide-ungrowth (hereinafter referred to as "FOU") phenomenon occurs. FIG. 1d shows such an FOU phenomenon in which the field oxide is not grown at its center. Particularly, if the FOU phenomenon occurs at even one place of the peripheral circuits, the field oxide is not formed, so that an electrical short occurs, making it impossible for the devices to function.

Therefore, the conventional techniques which take advantage of high temperatures of 1,050° C. or higher to improve the field oxide thinning effect, have an inevitable problem to be solved, the FOU phenomenon.

SUMMARY OF THE INVENTION

Therefore, it is an object of the present invention to overcome the above problems encountered in prior arts and to provide a method for forming a field oxide of a semiconductor device, which can take advantage of high temperature field oxidation with prevention of the FOU phenomenon.

It is another object of the present invention to provide a semiconductor device comprising an FOU-free element isolation film formed through high temperature field oxidation.

In accordance with an aspect of the present invention, there is provided a method for forming a field oxide of a semiconductor device, comprising the steps of: constructing an element isolation mask on a semiconductor substrate; forming a nitride spacer at the side wall of the mask; oxidizing the exposed region of the semiconductor substrate at a temperature of 1,050–1,200° C. to grow a recess oxide; removing the recess oxide to create a trench in the semiconductor substrate; and subjecting the semiconductor substrate to thermal oxidation, to form the field oxide.

In accordance with another aspect of the present invention, there is provided a semiconductor device, comprising a field oxide which is formed by oxidizing a field region of a semiconductor substrate at a temperature of 1,050–1,200° C. to grow a recess oxide; removing the recess-oxide to create a trench in the semiconductor substrate; and thermally oxidizing the semiconductor substrate.

BRIEF DESCRIPTION OF THE DRAWINGS

The above and other objects and aspects of the invention will become apparent from the following description of embodiments with reference to the accompanying drawings in which.

DETAILED DESCRIPTION OF THE PREFERRED EMBODIMENTS

Figure 1A:
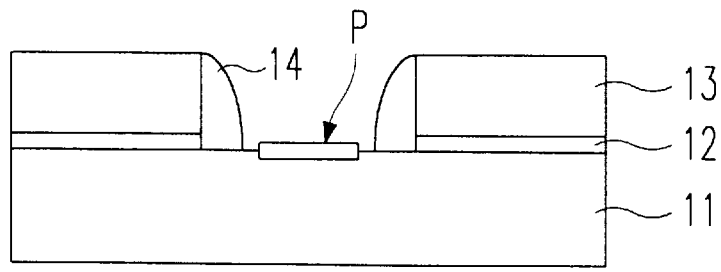
FIGS. 1a through 1d are schematic cross sectional views showing a conventional method for forming a field oxide of a semiconductor device.

The application of the preferred embodiments of the present invention is best understood with reference to the accompanying drawings, wherein like reference numerals are used for like and corresponding parts, respectively.

Referring to FIG. 3, there are stepwise illustrated processes for forming a field oxide of a semiconductor device, according to the present invention.

Figure 3A:
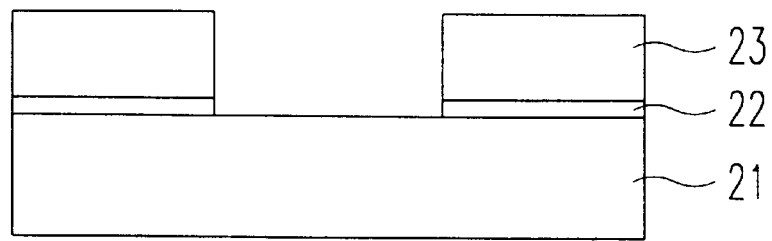
FIGS. 3a through 3f are schematic cross sectional views showing a method for forming a field oxide of a semiconductor device, according to the present invention.

As shown in FIG. 3a, a semiconductor substrate 21 is oxidized to form a pad oxide 22 and then, entirely deposited with a nitride 23. The nitride 23 and the pad oxide 22 are selectively removed at a field region.

Figure 3B:
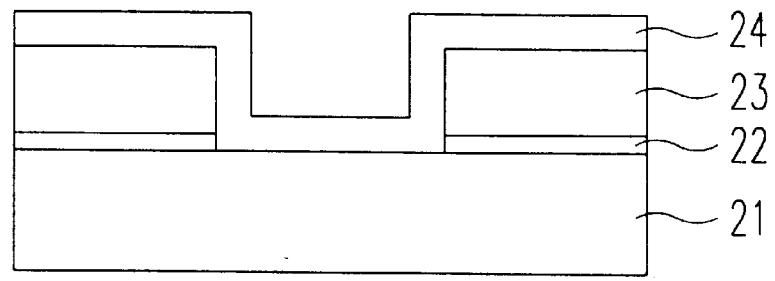

FIG. 3b is a cross section after a nitride 24 is deposited at a predetermined thickness on the resulting structure.

Figure 3C:
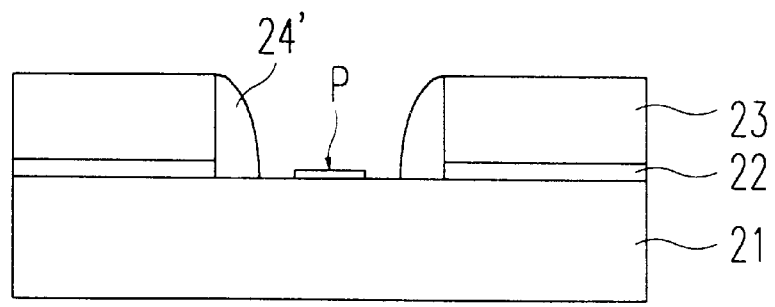
Figure 3D:
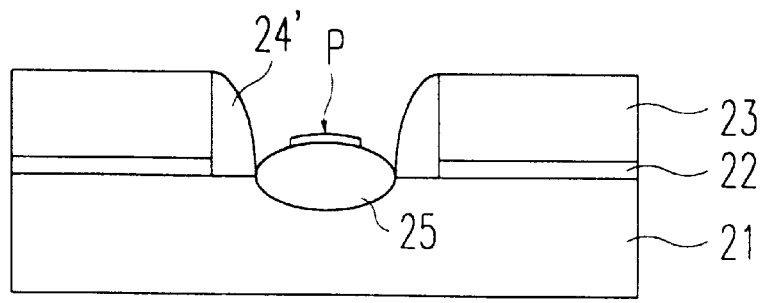

Subsequently, the nitride 24 is dry-etched to give a nitride spacer 24', as shown in FIG. 3c. It is also shown that a nitrogen-containing polymer P remains on the center of the field region. As aforementioned, the polymer is by no means removed by conventional wet washing as it binds to the semiconductor substrate.

Thereafter, the semiconductor substrate 21 is oxidized at a temperature of 1,050–1,200° C. to grow a recess oxide 25 to a thickness of 200–500 Angstrom while instantaneously subjecting the nitrogen-containing polymer P to phase-transformation into a silicon nitride P'. As a result of this high temperature oxidation, the silicon nitride P' is on the recess oxide 25.

Figure 1B:
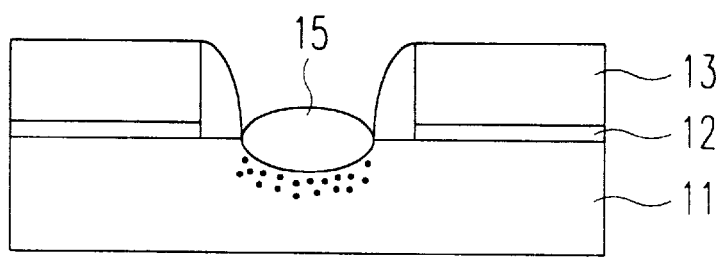
Figure 1C:
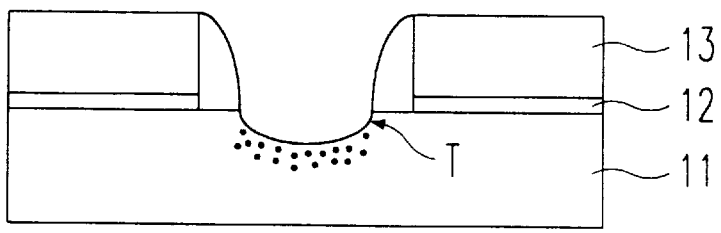
Figure 1D:
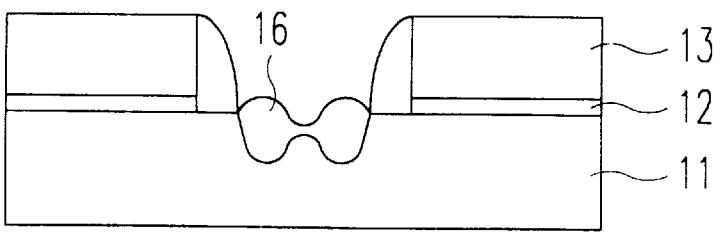
Figure 2:
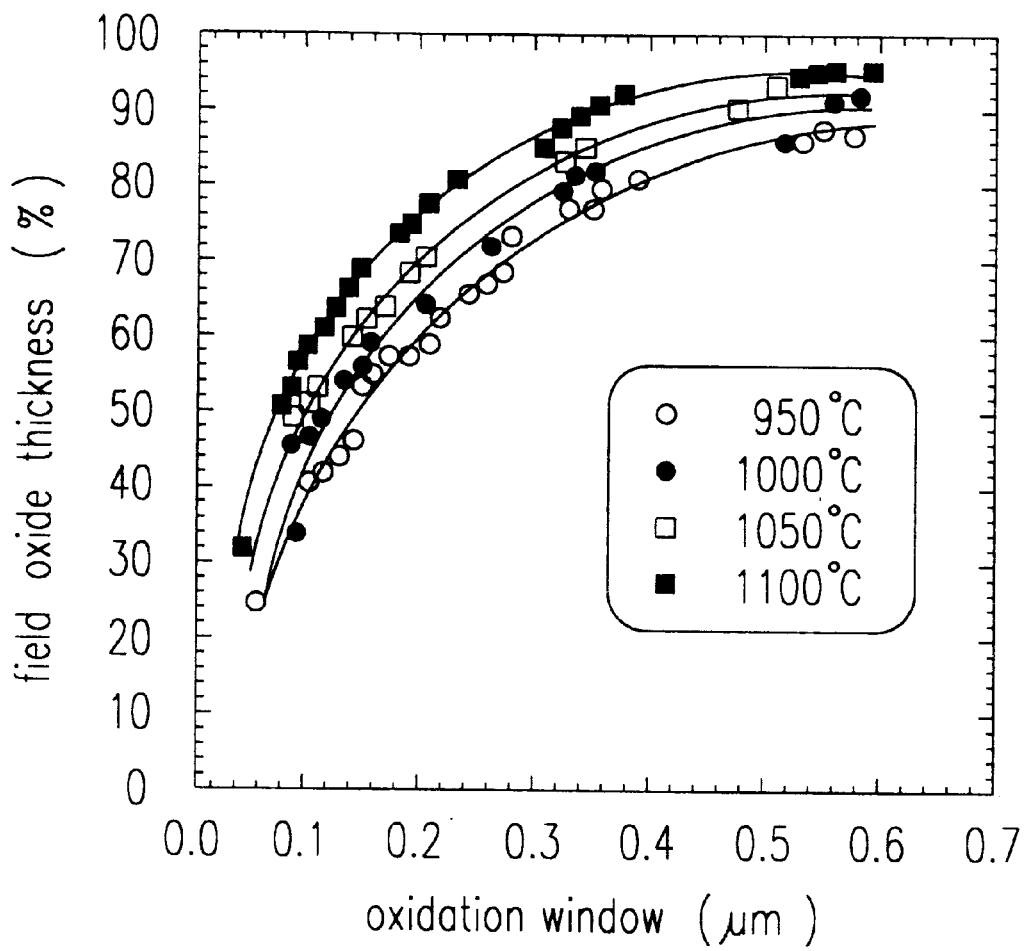
FIG. 2 shows experiment data for the relation of field oxide's thickness with field oxidation temperature.

In contrast, if the oxidation temperature is 800–900° C., the nitrogen in the polymer is redistributed in the interface between the recess oxide 25 and the semiconductor substrate 21, as shown in FIG. 1b.

In accordance with the present invention, in order to prevent the redistribution of the nitrogen-containing polymer P, the recess oxidation is carried out at a temperature of 1,050–1,200° C. to instantaneously phase-transform the nitrogen-containing polymer P into a silicon nitride. Dry oxidation is advantageous for the easy control of its thickness.

Figure 3E:
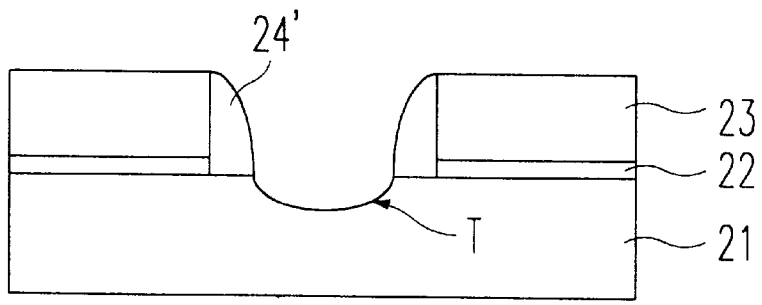

FIG. 3e is a cross section after the recess oxide 25 is etched with an HF etchant to form a trench T. Of course, the silicon nitride P' on the recess oxide is also removed.

Figure 3F:
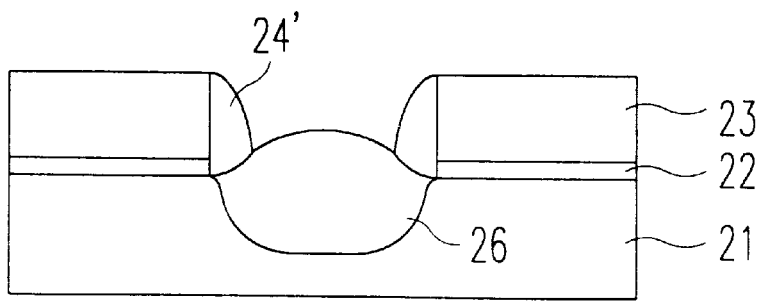

FIG. 3f is a cross section after the exposed region of the semiconductor substrate 21 is oxidized at a temperature of 1,050–1,200° C. to form a field oxide 26. As seen, even when the field oxide is grown at 1,050–1,200° C., no FOU phenomenon occurs with prevention of the field oxide thinning effect.

As described hereinbefore, when the recess oxidation is carried out at a high temperature of 1,050–1,200° C., the nitrogen-containing polymer is phase-transformed into a silicon nitride during the growth of a recess oxide and thus, can be removed together with the recess oxide. Consequently, the method of the present invention can prevent an FOU phenomenon upon the growth of a field oxide and improve the field oxide thinning effect, thereby bringing a significant improvement to the production yield and the reliability of a semiconductor device.

What is claimed is:

1. A method for forming a field oxide of a semiconductor device, comprising the steps of:

constructing an element isolation mask on a semiconductor substrate;

forming a nitride spacer at the side wall of said mask;

oxidizing the exposed region of said semiconductor substrate at a temperature of 1,050–1,200° C. to grow a recess oxide;

removing said recess oxide to create a trench in said semiconductor substrate; and subjecting said semiconductor substrate to thermal oxidation, to form the field oxide.

2. A method in accordance with claim 1, wherein said recess oxide is grown to a thickness of approximately 200–500 Angstrom.

3. A method in accordance with claim 1, wherein said oxidizing step to grow the recess-oxide is carried out in a dry atmosphere.

4. A method in accordance with claim 1, wherein said thermal oxidation to form the field oxide is carried out at a temperature of 1,050–1,200° C.

5. A method in accordance with claim 1, wherein said element isolation mask has a laminated structure consisting of a pad oxide and a nitride.

6. A method in accordance with claim 1, wherein said forming step of the nitride spacer produces a nitrogen-containing polymer and said oxidizing step transforms the nitrogen-containing polymer into a nitride which can remain on said recess-oxide.

7. A method in accordance with claim 1, wherein said recess-oxide is removed with a hydrofluoric acid etchant.

* * * * *